(12) United States Patent
Bernier et al.

(10) Patent No.: US 7,316,572 B2
(45) Date of Patent: Jan. 8, 2008

(54) COMPLIANT ELECTRICAL CONTACTS

(75) Inventors: William E. Bernier, Endwell, NY (US); David E. Eichstadt, Des Plaines, IL (US); Mukta G. Farooq, Hopewell Junction, NY (US); John U. Knickerbocker, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/906,111

(22) Filed: Feb. 3, 2005

(65) Prior Publication Data

US 2006/0172565 A1   Aug. 3, 2006

(51) Int. Cl.
*H01R 12/00* (2006.01)

(52) U.S. Cl. .................................. 439/66; 439/489

(58) Field of Classification Search ............ 439/489, 439/66
See application file for complete search history.

(56) References Cited

U.S. PATENT DOCUMENTS

| | | | |
|---|---|---|---|
| 5,023,205 | A | 6/1991 | Reche |
| 5,736,448 | A | 4/1998 | Saia et al. |
| 6,187,615 | B1 | 2/2001 | Kim et al. |
| 6,281,111 | B1 | 8/2001 | Ohsumi |
| 6,528,349 | B1 | 3/2003 | Patel et al. |
| 6,690,081 | B2 | 2/2004 | Bakir et al. |
| 6,743,556 | B2 | 6/2004 | Elizur et al. |
| 6,948,940 | B2 * | 9/2005 | Lindsey et al. ............ 439/66 |
| 2003/0122229 | A1 | 7/2003 | Bakir et al. |

OTHER PUBLICATIONS

Li et al., "A Wide Area Vertical Expansion (WAVE) Packaging Process Development", Electronic Components and Technology Conference, 2001, pp. 367-371.
Patel et al., "Electrical Performance of Compliant Wafer Level Package", Electronic Components and Technology Conference, 2001, pp. 1380-1383.
Reed et al., Compliant Wafer Level Package (CWLP) With Embedded Airgaps for Sea of Leads (SoL) Interconnections, IEEE, 2001, pp. 151-153.
Haynes et al., "Trends Shaping the Digital Economy An Introduction", Trends Report, 2001, pp. 1-9.
Patel et al., "Cost Analysis of Compliant Wafer Level Package", Electronic Components and Technology Conference, 2000, pp. 1634-1639.
Patel et al., "Cost Analysis of Compliant Wafer Level Package", Electronic Components and Technology Conference, 2000, pp. 278-286.

* cited by examiner

*Primary Examiner*—Truc Nguyen
(74) *Attorney, Agent, or Firm*—Gibb & Rahman, LLC; Joseph Petrokaitis, Esq.

(57) ABSTRACT

A method of forming compliant electrical contacts includes patterning a conductive layer into an array of compliant members. The array of compliant members is then positioned to be in contact with electrical connection pads on an integrated circuit wafer and the compliant members are joined to the pads. Then, the supporting layer that supported the compliant members is removed to leave the compliant members connected to the pads.

14 Claims, 6 Drawing Sheets

COMPLIANT ELECTRICAL CONTACTS

BACKGROUND OF THE INVENTION

1. Field of the Invention

The invention provides a method of forming compliant electrical contacts that includes patterning a conductive layer into an array of compliant members, and then joining the array of compliant members to contact pads on a wafer.

2. Description of the Related Art

Electrical interconnections are often needed between integrated circuits, packages, boards, wafers, probes and other hardware which may be made from similar or dissimilar materials and may be coplanar or non-coplanar in nature. Often many connections are needed with semiconductor devices. Further, the features sizes and pitch of the connections to be interconnected are increased in number and reduced in size with advances of new generations of products over time. The characteristics that are desirable include the ability to have good electrical conduction while maintaining low electrical parasitics such as low inductance and capacitance for signal connections, provide good current carrying capability for power and ground connections, provide good mechanical integrity so electrical continuity can be assured even within or between different materials which may undergo expansion and contraction during power up, power down, thermal cycles, etc. This can produce stress and strains in the interconnection structures and thus lead to fatigue, opens, or electrical failures depending on the structure and application use conditions.

Chip interconnect reliability and processing requirements are dramatically changing with the industry-wide change from leaded solders to lead-free solder metallurgy. Moving to a lead-free interconnect technology typically induces reliability concerns due to limited data for specific application reliability and in some cases poor thermal cycling performance of non-leaded systems and structure, resulting in device failures. In some cases, solutions have addressed the reliability concerns using various approaches, however the interconnect resistance has increased, which is also undesirable. Current connections to wafers do not give sufficient compliance to movement.

The below-referenced U.S. patents disclose embodiments that were satisfactory for the purposes for which they were intended. The disclosures of the below-referenced prior U.S. patents, in their entireties, are hereby expressly incorporated by reference into the present invention for purposes including, but not limited to, indicating the background of the present invention and illustrating the state of the art. Further, the following U.S. patents explain many well known manufacturing processes/materials that can be used to form components mentioned below; however, the following U.S. patents do not disclose the unique methodology and/or structural features included within the invention, even if the inventive features utilize well known manufacturing processes/materials to achieve the unique methodology/structure. So as to not obscure the salient features of the invention, a detailed discussion of such well-known processing methods and materials is not included herein.

U.S. Pat. No. 6,528,349 shows monolithically fabricated compliant wafer level features fabricated on the wafer as additional steps of processing a wafer. These steps build a compliant interconnection up from the wafer utilizing photolithography, deposition processes (such as plating or sputter coating) to sequentially build a compliant interconnection off of a die pad, and forming solder for connection to a corresponding package for interconnection. When the compliant members are formed on the wafer, the processing and materials that can be used are limited so as not to damage the wafer or its internal circuitry.

Other references have shown the use of materials such as polymer materials to enhance the compliance of the interconnection (U.S. Pat. No. 6,690,081 and U.S. patent application Ser. No. 2003/0122229). Such references show compliant connections on a wafer at densities as high as 10000 to 20000 connections per centimeter squared. Again, however, while the monolithic fabrication of compliant members on a wafer can provide benefit by using semiconductor tools and sequential build up operations, this processing is limited to processes which do not damage the circuits and underlying interconnections.

These restrictions that result from forming the compliant members on the wafer limit the desired compliance of the build up connections. This can also negatively impact yields of useful and often expensive chips especially if the interconnection build up has defects which causes fall out or may degrade the performance or reliability of underlying devices and interconnection due to the multitude of additional processing steps being utilized. Other U.S. patents that are incorporated herein by reference including U.S. Pat. Nos. 5,023,205; 6,187,615; 5,736,448; 6,281,111 illustrate additional well known processing relating to compliant connections.

SUMMARY OF THE INVENTION

The invention provides a method of forming a compliant electrical contact that includes patterning a conductive layer into an array of compliant members. The array of compliant members is then positioned to be in contact with electrical connection pads on an integrated circuit wafer and the compliant members are joined to the pads. Then, the supporting layer that supported the compliant members is removed to leave the compliant members connected to the pads.

To join the compliant members to the pads, the invention can exert pressure between the supporting member and the wafer (to cause the compliant members to press against the pads) and then heat the compliant members and the wafer to join the two together. Alternatively, prior to positioning the array of compliant members next to the pads, the invention can position a metallic paste layer over the pads and then laser transfer the metallic paste onto the pads. Then, the metallic paste can be reflowed in order to join the compliant members to the pads. In another alternative, the invention can form solder on exposed ends of the compliant members prior to joining the compliant members with the pads. In another alternative, the invention can form the compliant interconnections on another silicon wafer and can shape the compliant interconnections by using etched shapes in the silicon or by fabricating the structures on the surface of the wafer where the resulting compliant interconnections can be transferred or permanently attached to a wafer with circuitry using copper to copper bonding, or alternate bonding technology.

Because the invention forms the array of compliant members separately from the more expensive active circuit wafer and subsequently joins the array of compliant members to the active circuit wafer, the compliant members can be shaped and inspected/tested before positioning the array of compliant members in contact with the pads. Further, this process allows the alloy that is used for a compliant members to be made at temperatures that exceed those which would damage the wafer and associated active or passive circuitry. In addition, this aspect of the invention allows the compliant members to be plated, and where appropriate, heat treated using processing which would damage the integrated circuit wafer. Thus, by forming compliant members separately from the wafer (as opposed to forming the compliant members sequentially on the surface of the wafer) and then connecting the compliant members to the wafer, the invention is not restricted from structures, processing techniques, materials, etc. that would normally damage the wafer and its associated circuitry.

The resulting structure has a number of advantages including that the compliant members comprise an alloy (in one example e.g., copper beryllium, W, Mo, Ni, Cu, Au, Pt, Pd, composites or alloys but is not limited to these and is capable of being formed only using processing that would damage the integrated circuit structure if built sequentially after fabrication of circuits on the wafer. Further, the compliant members can comprise plated materials and temperature annealed or heat treated structures and materials capable of being formed only using processing that would damage the integrated circuit structure. The invention also permits a non-alloy solder (e.g., copper) to join the compliant members to the contact pads. In addition, the process permits fabrication and interconnection of two or more stacked or adjacent surfaces by incorporation of one or more joining compliant interconnection layers.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which.

DETAILED DESCRIPTION OF PREFERRED EMBODIMENTS OF THE INVENTION

Figure 1:
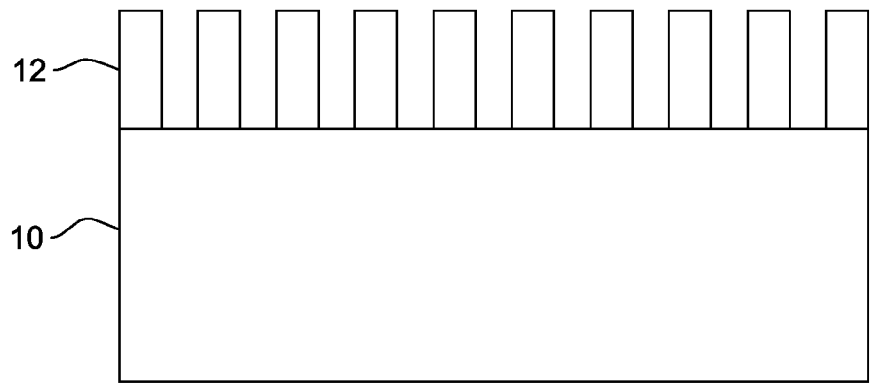
FIG. 1 is a schematic cross-sectional diagram of a mask formed over a compliant conductive material.
Figure 2:
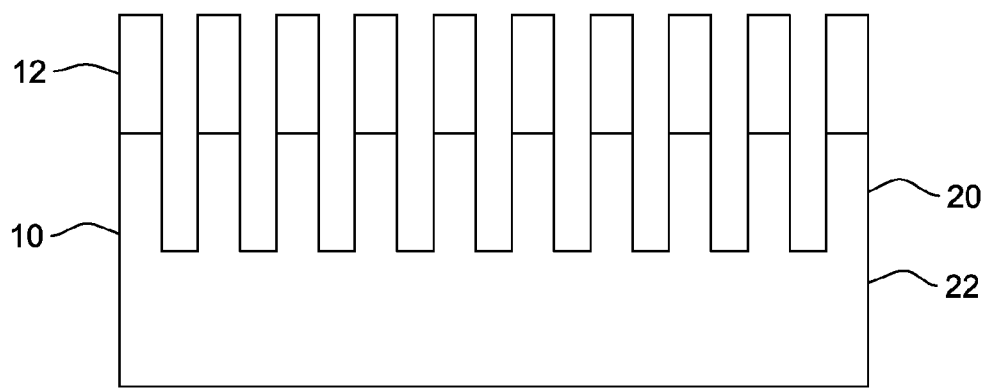
FIG. 2 is a schematic cross-sectional diagram of patterned compliant conductive material.

As mentioned above, there is an ever increasing need to improve compliant connections within integrated circuit devices. The invention allows more durable and more compliant materials to be used with integrated circuit wafers by separately prefabricating the array of compliant members and then attaching the array of compliant members to the wafer. More specifically, as shown in FIG. 1, the invention forms a layer of compliant conductive material 10. This material 10 can be formed by means of chemical, electrochemical, or alternate fabrication operations to provide an alloy of compliant connections, metal/polymer structures. Because material 10 is prefabricated with respect to the integrated circuit wafer, can be made of any material including any of the materials discussed in the U.S. patents mentioned in the background section, or any other similar material whether now known or developed in the future.

Current manufacturing processes utilize copper for compliant connections however non-alloy copper encounters some limitations. Therefore, with the invention any conductive compliant material (such as copper) could be combined with many other different types of materials (such as beryllium) to form an alloy that is superior as a compliant conductive material. As shown in the background section, conventional methodologies form the compliant connections directly on the integrated circuit wafer and these processes are therefore limited so as not to damage the integrated circuit wafer. To the contrary, the material 10 shown in FIG. 1 can be formed according to any manufacturing process (e.g., high temperature, caustic environment, high-pressure, highly charged processes) without regard to the integrated circuit wafer because the material 10 is formed separately from the integrated circuit wafer to which it eventually will be joined (and there is structural indicia indicating that the compliant member was prefabricated, including evidence of post-formation attachment, different material usage, lack of compliant material residue on the integrated circuit wafer, etc.).

FIG. 1 also illustrates a mask 12 which can comprise any common organic or inorganic mask, such as those discussed in the U.S. patents mentioned in the background section. The material 10 is then patterned using any conventional material removal process (such as those discussed in the U.S. patents mentioned in the background section) to produce individual compliant members 20 that are supported by a support member 22. Note that in this embodiment, the support member 22 comprises the unpatterned portion of the original material 10; however, support member 22 could comprise a separate material.

Figure 3:
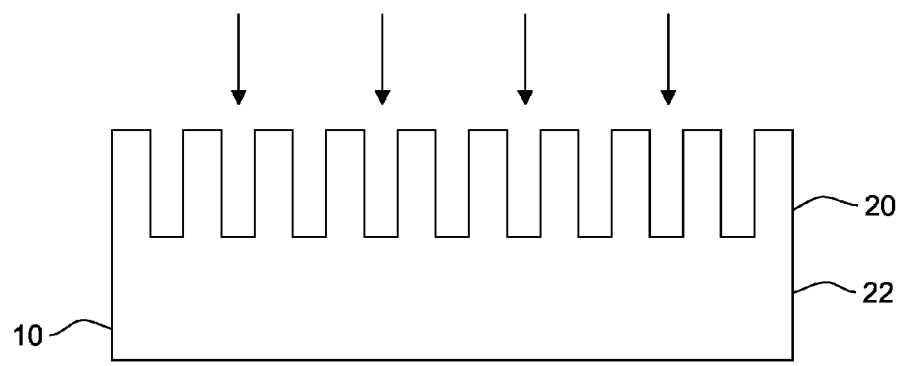
FIG. 3 is a schematic cross-sectional diagram of compliant members.

In addition, this aspect of the invention allows the compliant members 20 to be plated (as shown by the arrows in FIG. 3) using processing that would damage the integrated circuit wafer. Further, the compliant members 20 can be inspected (using, for example, visual inspection, x-ray, electrical testing, etc.) prior to being connected to the integrated circuit wafer, as also shown by the arrows in FIG. 3.

At this point, the compliant interconnections 20 can be shaped to have sharpened probe tips to permit scrubbing to a contact pad on a chip. This would also allow the interconnections to puncture through a surface oxide or into a solder for purposes of testing, probing or contacting for wafer test, burn-in or other functional assessment. Similarly, compliant connections may be made for either temporary or permanent connection of a thermal conductor to provide one or more thermal paths from a electrical or optical chip, package, or other product to enable heat transfer from one surface to another.

Figure 4:
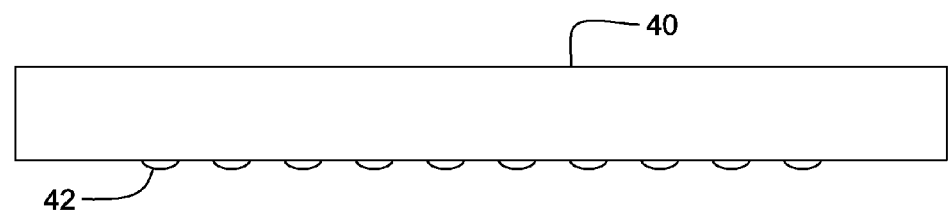
FIG. 4 is a schematic cross-sectional diagram of compliant members being connected to a wafer.
Figure 4:
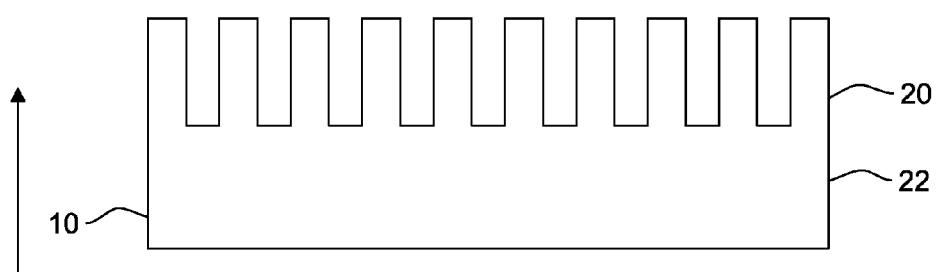
Figure 5:
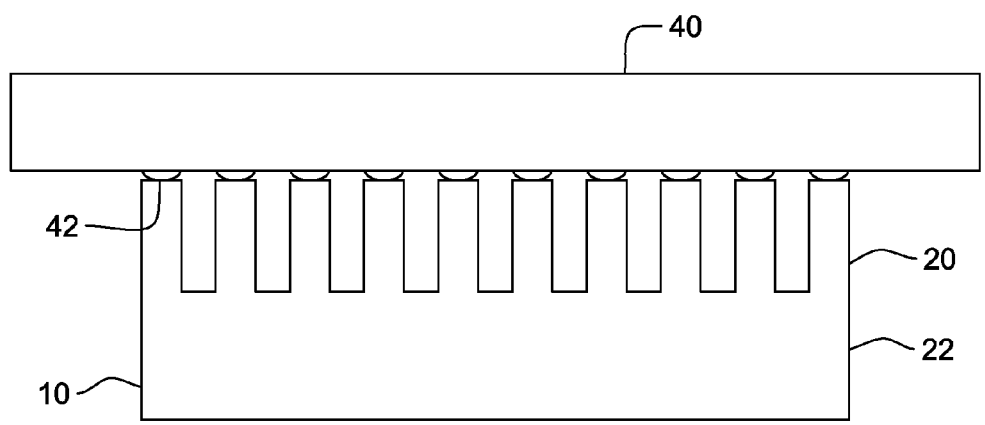
FIG. 5 is a schematic cross-sectional diagram of compliant members connected to a wafer.

Next, the array of compliant members 22 is positioned to be in contact with electrical connection pads 42 on an integrated circuit wafer 40 (as shown by the arrow in FIG. 4) and the compliant members are joined to the pads 42 as shown in FIG. 5. The integrated circuit wafer 40 includes many temperature, chemical, and environmental sensitive circuits.

To join the compliant members 20 to the pads 42, the invention can exert pressure between the supporting member 22 and the wafer 40 (to cause the compliant members 20 to press against the pads 42) and then heat the compliant members 20 and the wafer 40 to join the two together (including thermal joining such as sintering, transient liquid phase joining, mechanical joining such as ultrasonic bonding, etc.).

Figure 6:
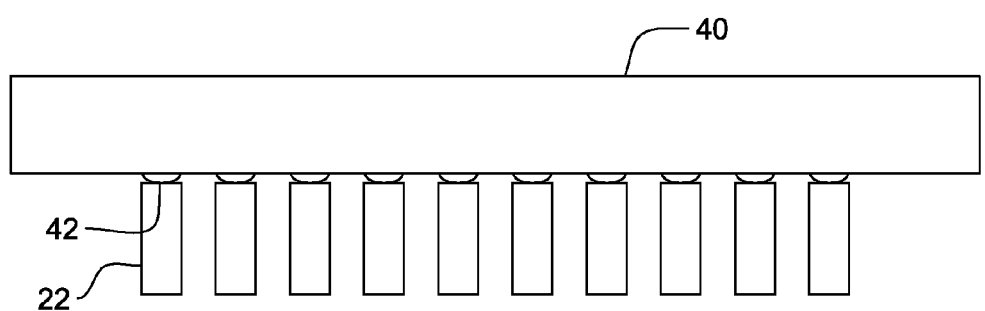
FIG. 6 is a schematic cross-sectional diagram of compliant members connected to a wafer.
Figure 7:
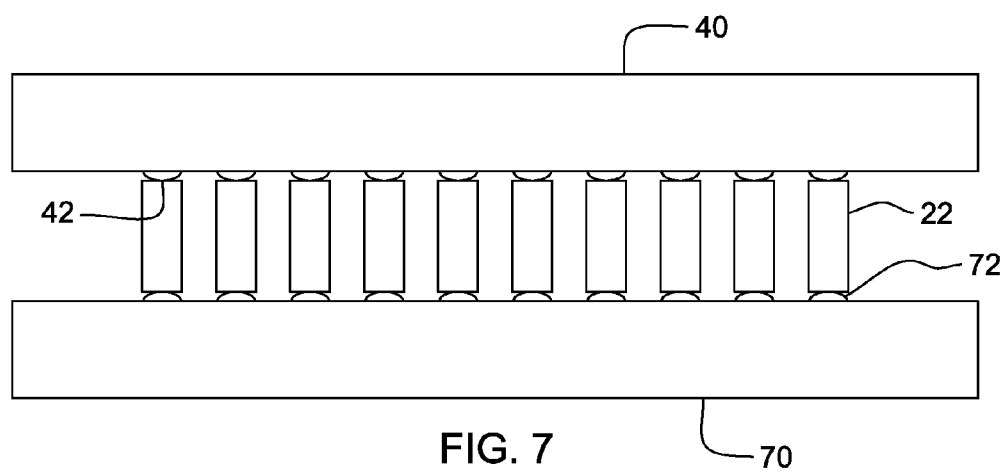
FIG. 7 is a schematic cross-sectional diagram of compliant members connected between a wafer and a chip carrier.

The supporting layer 22 that supported the compliant members 20 is removed (again using any well-known material removal process) to leave the compliant members connected to the pads 42 as shown in FIG. 6. Then, the compliant members 22 can be connected to contact pads 72 on a chip carrier 70, as shown in FIG. 7.

By forming the compliant members 20 separately from the wafer 40 (as opposed to forming the compliant members 20 on the wafer 40) and then connecting the compliant members 20 to the wafer 40, the invention is not restricted from activities, processing techniques, materials, etc. that would normally damage the wafer 40 and its associated circuitry.

Figure 8:
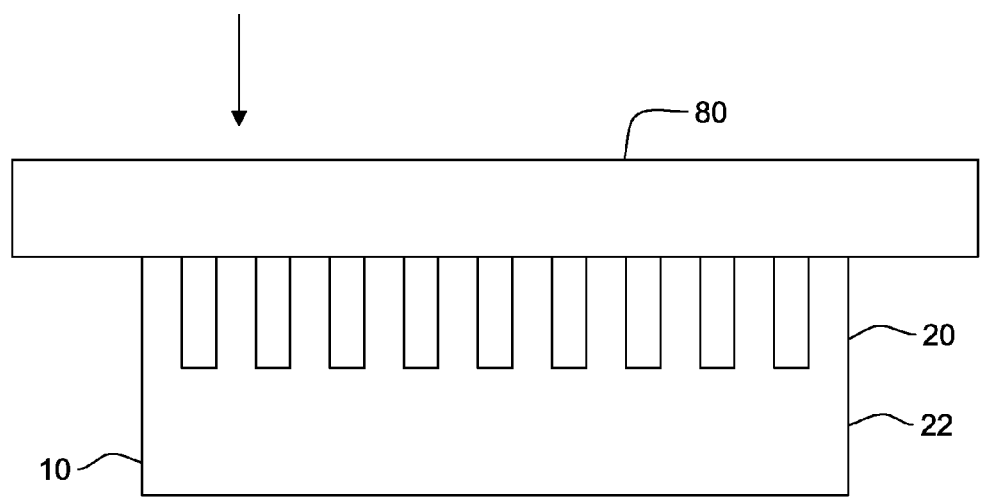
FIG. 8 is a schematic cross-sectional diagram of conductive material being laser transfer onto compliant members.
Figure 9:
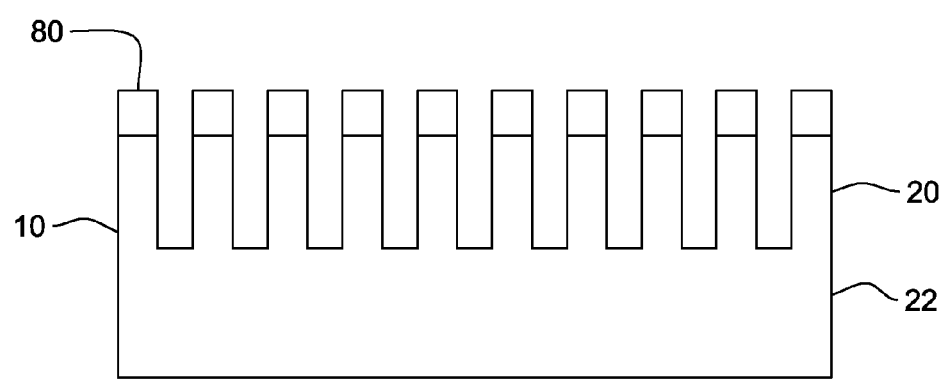
FIG. 9 is a schematic cross-sectional diagram of conductive material on compliant members.

Alternatively, the invention can position a metallic paste layer 80 over the pads 42 and then laser transfer the metallic paste 80 onto the pads 42 as shown by the arrow in FIG. 8. FIG. 9 illustrates the metallic paste sections 80 after they have been laser transferred onto the compliant members 20 (see U.S. Pat. No. 6,743,556, incorporated herein by reference, for a detailed explanation of laser transfer techniques). Then, after the compliant members 20 are positioned to be in contact with the electrical connection pads 42, the metallic paste 80 can be reflowed in order to join the compliant members 20 to the pads 42. In another alternative, the invention can form solder (also represented by item 80 in FIG. 9) on exposed ends of the compliant members 20 prior to joining the compliant members 20 with the pads 42. The solder 80 can be any form of well-known lead-based or lead free solder (whether currently known or developed in the future) and can be deposited using any well-known methodology such as screen printing, dipping, etc., including any solder deposition/formation process mentioned in the U.S. patents discussed in the background section above.

One alternate embodiment permanently joins a second thinned silicon wafer (containing through via connections and compliant interconnections) rather than removing the supporting layer. Another embodiment leverages the ability to reactively ion etch or alternatively create through connections in silicon in various shapes. The invention can plate or fill these structures and later remove the rigid silicon and or oxides so as to form compliant conductors of metal or composite metal and polymer or metal and inorganic composite or metal, inorganic ceramic and polymer composite for enhanced compliance.

Figure 10:
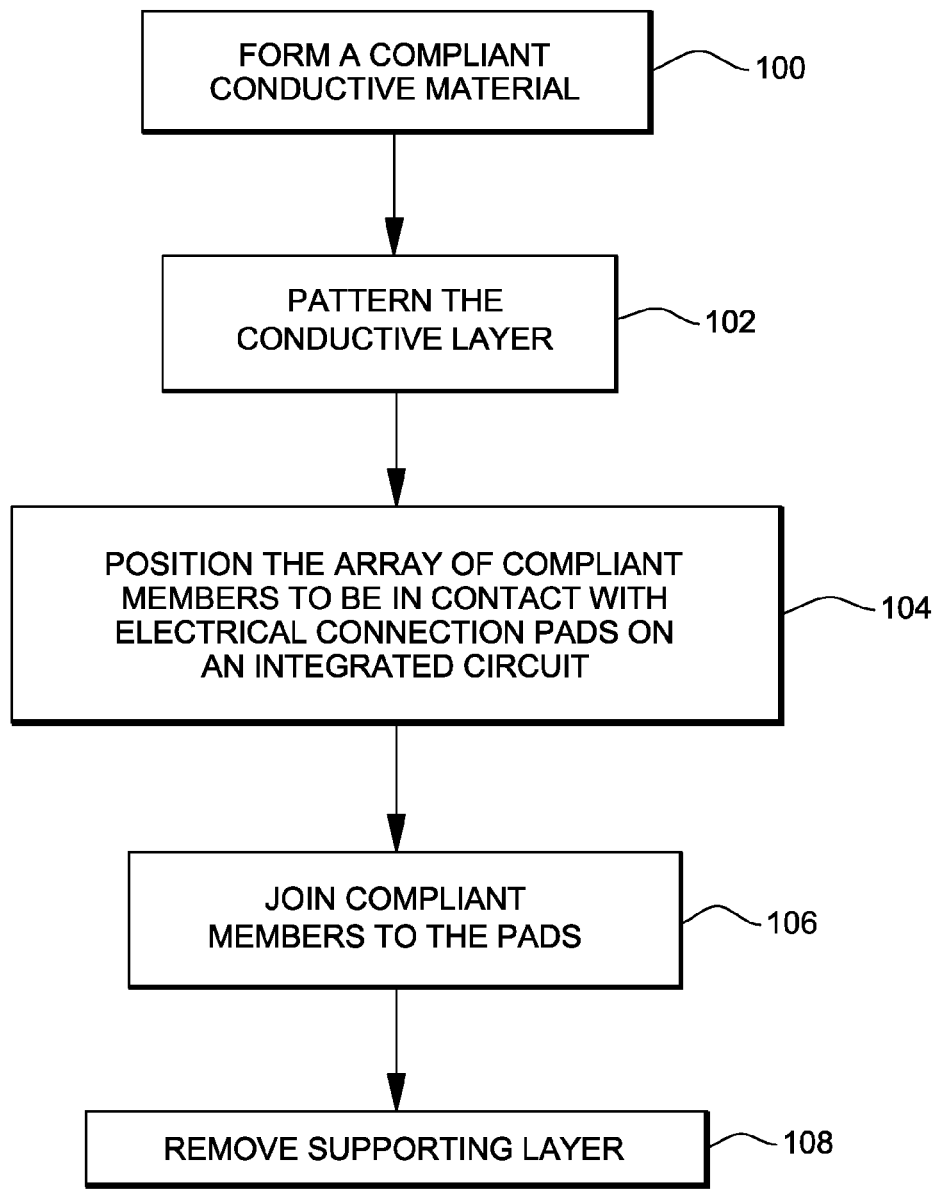
FIG. 10 is a flow diagram illustrating aspects of embodiments described herein.

The overall processing steps are shown in flowchart form in FIG. 10. More specifically, in item 100, the invention begins by forming a compliant conductive material separate from an integrated circuit wafer. Next, in item 102, the conductive layer is patterned into an array of compliant members. The array of compliant members is then positioned to be in contact with electrical connection pads on an integrated circuit wafer in item 104 and the compliant members are joined to the pads in item 106. Then, the supporting layer that supported the compliant members is removed to leave the compliant members connected to the pads in item 108.

Thus, as shown above, because the invention forms the array of compliant members 20 separately from the wafer 40 and subsequently joins the array of compliant members 20 to the wafer 40, the compliant members 20 can be shaped and inspected/tested before positioning the array of compliant members 20 in contact with the pads 42. Further, this process allows the alloy that is used for a compliant members 20 to be made at temperatures that exceed those which would damage the wafer 40 and associated circuitry.

The resulting structure has a number of advantages including that the compliant members 20 can comprise an alloy (e.g., copper beryllium, W, Mo, Ni, Cu, Au, Pt composites alloys etc.) capable of being formed only using processing that would damage the integrated circuit structure. Further, the compliant members 20 can comprise plated materials capable of being formed only using processing that would damage the integrated circuit structure. The invention also permits a non-alloy solder (e.g., copper) to join the compliant members 20 to the contact pads 42.

The ability to test, probe or burn-in wafers, chips, packages can be challenged when contacting many small features and may not be able to obtain adequate contact force and compliance to accommodate non planar features, or features which may move due to thermal excursions. Similarly, the ability to provide compliant thermal cooling solutions or supplement thermal dissipation can be challenging when taking heat from semiconductor chips or when transferring heat between interfaces, and especially between dissimilar materials.

In another alternative, the inventive method and structure for fabricating the compliant interconnections can use a semiconductor device process, and/or microelectromechanical (MEMS) process. The desired shapes can be formed in or on a device, and the metallization of the compliant interconnections can be CVD deposited, plated, or formed through a combination of operations to fill or partially fill the etched or pre-formed shapes. In addition, the invention can be used to join or test against one or more pads using an electrical current or electrical voltage. Thus, fabrication of the structures and process may not only support electrical applications but may service mechanical, electromechanical or alternate uses.

Thus, as shown above, the invention provides several structures and methods to achieve compliant interconnections which may be used for permanent or temporary electrical interconnection, probe contact and thermal contact. The invention provides enhanced compliance of the interconnection, resulting in improved reliability prior to failure of connections, and the ability to prefabricate and pretest connections for enhanced yield. Further, the invention minimizes the number of processing steps that a semiconductor, package, passive component, board, or other product is subjected to. The invention is beneficial by providing compliant interconnections built from superior metal alloys such as Copper Beryllium (which is beneficial when compared to copper alone). Thus, the invention obtains improved compliant properties from optimized fabrication steps, temperatures and microstructural development so as to give superior reliability compared to monolithically fabricated structures.

The invention further can leverage use of metals, metal & alloys and polymers which can be processed in parallel to wafers using either semiconductor process equipment for high interconnection densities even exceeding 50000 to 400000 connections per centimeter with subsequent joining and transfer to a wafer by means of use of a solder or alternate conductor such as Au/Sn. The invention can also use a transfer polymer adhesive to join and encapsulate the microjoints and/or, use more traditional processing connections of from 1 to 5,000,000 connections per centimeter. Because the compliant members are formed separately from the wafer, the compliant interconnections may be shaped prior (or subsequent) to joining to the wafer, package or device and may contain solder deposition, copper to copper bonding, or alternate means to connect to a corresponding pad. For one embodiment using wafer to wafer joining where one wafer has the formed shapes contained in or on the joining wafer, the two structures may be joined using conductor to conductor joining and the handling wafer can then be removed by etching or may remain as a rigid part of the structure.

The attached floating spring interconnection discussed above provides enhanced compliant interconnection and can be utilized with cost effective wafer processing while providing enhanced mechanical properties and known good compliant interconnection for high yield. This technology can be applied to semiconductors for chip interconnection, for electrical interconnection, to enhance thermal conductivity, for heat dissipation off front side or back side of wafer 40s, can be applied to packaging, to 3-Dimensional structures in chip or semiconductor integration, and or for application well suited for materials with different thermal coefficients of expansion which may be subjected to thermal excursions. In addition, this technology is well suited to support compliant probes to support wafer 40 test, chip test, burn in, and provide fine pitch probing of fine features such as pads 42, microjoints and interconnection features. The technology also is well suited to support area array interconnections. The technology provides means to utilize metal, metal alloy and metal polymer and or composite features which may leverage material and process advantages over alternate approaches considered for use in applications at present.

Other benefits which flow from invention include the ability to scale the size of compliant interconnections to meet application needs such as chip attach, test, burn-in testing, functional testing, socket assembly etc. The invention provides the ability to define material, process, and structure for compliant interconnections which can be fabricated at high volume and low cost, but leverage industry available semiconductor, etching, process, joining, metallization techniques without being limited by constraints imposed by active semiconductor sequential processing. These structures may service not only electrical interconnection, electrical testing, and electrical probing, but may also provide mechanical spring, electromechanical, optical, alignment, or other benefits for miniature or more macroscopic needs.

While the invention has been described in terms of embodiments, those skilled in the art will recognize that the invention can be practiced with modification within the spirit and scope of the appended claims.

What is claimed is:
1. A structure comprising:
a device having at least one contact pad;
compliant members electrically connected to said contact pad,
wherein said compliant members comprise a conductive alloy of copper,
wherein said compliant members comprise copper to copper bonding,
wherein said compliant members comprise sharpened probe tips; and
structural indicia comprising a portion of said compliant members, wherein said structural indicia indicates that said compliant members comprise a prefabricated structure manufactured separately from said device, comprising at least one of marks of post-formation attachment and different material.

2. The structure in claim 1, all the limitations of which are incorporated herein by reference, wherein said compliant members comprise one of a metal, metal alloy, composite of metal, metal and polymer combination, metal and ceramic combination, and metal-ceramic-polymer combination.

3. The structure in claim 1, all the limitations of which are incorporated herein by reference, wherein said compliant members have structural indicia indicating that said compliant members comprise at least one of a plated material and a chemical vapor deposited material.

4. The structure in claim 1, all the limitations of which are incorporated herein by reference, further comprising a solder joining said compliant members to said contact pad.

5. The structure in claim 4, all the limitations of which are incorporated herein by reference, wherein said solder comprises copper.

6. A structure comprising:
a device formed from a first material that is vulnerable to damage from first processing techniques, wherein said device comprises at least one contact pad;
compliant members formed from second material that is invulnerable to said damage from said first processing techniques,
wherein said compliant members are electrically connected to said contact pad,
wherein said compliant members comprise a conductive alloy of copper,
wherein said compliant members comprise copper to copper bonding, and
wherein said compliant members comprise sharpened probe tips; and
structural indicia comprising a portion of said compliant members, wherein said structural indicia indicates that said compliant members comprise a prefabricated structure manufactured separately from said device, comprising at least one of marks of post-formation attachment and different material usage.

7. The structure in claim 6, all the limitations of which are incorporated herein by reference, wherein said compliant members comprise one of a metal, metal alloy, composite of metal, metal and polymer combination, metal and ceramic combination, and metal-ceramic-polymer combination.

8. The structure in claim 6, all the limitations of which are incorporated herein by reference, wherein said compliant members have structural indicia indicating that said compliant members comprise at least one of a plated material and a chemical vapor deposited material.

9. The structure in claim 6, all the limitations of which are incorporated herein by reference, further comprising a solder joining said compliant members to said contact pad.

10. A structure comprising:
a device having at least one contact pad;
compliant members electrically connected to said contact pad,
wherein said compliant members comprise a conductive alloy of copper,
wherein said compliant members comprise sharpened probe tips,
wherein said compliant members comprise at least one of Cu, Be, W, Mo, Ni, Co, Pt, Au, Pd, and alloys thereof, and
wherein said compliant members comprise copper to copper bonding; and
structural indicia comprising a portion of said compliant members, wherein said structural indicia indicates that said compliant members comprises a prefabricated structure manufactured separately from said device, comprising at least one of marks of post-formation attachment and different material usage.

11. The structure in claim 10, all the limitations of which are incorporated herein by reference, wherein said compliant members comprise one of a metal, metal alloy, composite of metal, metal and polymer combination, metal and ceramic combination, and metal-ceramic-polymer combination.

12. The structure in claim 10, all the limitations of which are incorporated herein by reference, wherein said compliant members have structural indicia indicating that said compliant members comprise at least one of a plated material and a chemical vapor deposited material.

13. The structure in claim 10, all the limitations of which are incorporated herein by reference, further comprising a solder joining said compliant members to said contact pad.

14. The structure in claim 13, all the limitations of which are incorporated herein by reference, wherein said solder comprises copper.

* * * * *